United States Patent
Fullam et al.

(10) Patent No.: US 10,139,934 B2
(45) Date of Patent: Nov. 27, 2018

(54) MAGNETIC TRACKER DUAL MODE

(71) Applicant: MICROSOFT TECHNOLOGY LICENSING, LLC, Redmond, WA (US)

(72) Inventors: Scott Francis Fullam, Palo Alto, CA (US); Lev Cherkashin, Redmond, WA (US); Steven James Velat, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/492,408

(22) Filed: Apr. 20, 2017

(65) Prior Publication Data
US 2018/0181216 A1 Jun. 28, 2018

Related U.S. Application Data

(60) Provisional application No. 62/438,319, filed on Dec. 22, 2016.

(51) Int. Cl.
*G06F 3/038* (2013.01)
*G01R 33/00* (2006.01)
(Continued)

(52) U.S. Cl.
CPC .......... *G06F 3/0383* (2013.01); *G01R 33/007* (2013.01); *G01R 33/0023* (2013.01); *G06F 3/011* (2013.01); *G06F 3/0346* (2013.01)

(58) Field of Classification Search
CPC ...... G06F 3/0383; G06F 3/011; G06F 3/0346; G01R 33/0023; G01R 33/007
See application file for complete search history.

(56) References Cited

U.S. PATENT DOCUMENTS

| 5,744,953 A | 4/1998 | Hansen |
| 8,321,173 B2 | 11/2012 | Wallance et al. |

(Continued)

FOREIGN PATENT DOCUMENTS

| WO | 02073287 A2 | 9/2002 |
| WO | 2016076733 A1 | 5/2016 |

OTHER PUBLICATIONS

Leydon, Krispin, "Sensing the Position & Orientation of Hand-Held Objects: An Overview of Techniques", http://www.krispinleydon.net/pubs/handheld_tracking.pdf, Retrieved on: Nov. 29, 2016, 1-15 pages.

(Continued)

*Primary Examiner* — Andrew Sasinowski
(74) *Attorney, Agent, or Firm* — Workman Nydegger

(57) ABSTRACT

A computer system for dynamically switching modes within a magnetic sensor device communicates through a secondary communication channel with a first magnetic sensor device and a second magnetic sensor device. The first magnetic sensor device includes at least a magnetic signal receiving functionality. The computer system determines that the second magnetic sensor device includes magnetic signal transmitting functionality and magnetic signal receiving functionality. After determining that the second magnetic sensor device includes magnetic signal transmitting functionality, the computer system causes the second magnetic sensor device to begin transmitting a first magnetic field signal.

20 Claims, 10 Drawing Sheets

(51) Int. Cl.
  *G06F 3/0346* (2013.01)
  *G06F 3/01* (2006.01)

(56) References Cited

U.S. PATENT DOCUMENTS

| | | |
|---|---|---|
| 8,700,376 B2 | 4/2014 | Ophir et al. |
| 8,970,690 B2 | 3/2015 | Meier et al. |
| 9,495,801 B2 | 11/2016 | Ebstyne et al. |
| 9,726,498 B2 * | 8/2017 | Meduna ................ G06F 1/3206 |
| 2003/0156144 A1 | 8/2003 | Morita |
| 2006/0256036 A1 | 11/2006 | Katano et al. |
| 2007/0132662 A1 | 6/2007 | Morita |
| 2009/0066725 A1 | 3/2009 | Nogami et al. |
| 2013/0249784 A1 | 9/2013 | Gustafson et al. |
| 2014/0103920 A1 * | 4/2014 | Sinanoglu .............. G01R 33/04 324/247 |
| 2015/0199106 A1 | 7/2015 | Johnson |
| 2016/0026265 A1 * | 1/2016 | Shaw .................... G06F 3/0346 345/158 |
| 2016/0259404 A1 * | 9/2016 | Woods ................. G06F 3/0346 |

OTHER PUBLICATIONS

"International Search Report and Written opinion Issued in PCT Application No. PCT/US2017/066905", dated Mar. 22, 2018, 12 Pages.

* cited by examiner

Handheld Controller 220

Head Mounted Display 210

MAGNETIC TRACKER DUAL MODE

CROSS-REFERENCE TO RELATED APPLICATIONS

This application claims priority to and the benefit of U.S. Provisional Application Ser. No. 62/438,319 entitled "Magnetic Tracker Dual Mode", filed on Dec. 22, 2016, which is incorporated by reference herein in its entirety.

BACKGROUND

Computers and computing systems have impacted nearly every aspect of modern living. Computers are generally involved in work, recreation, healthcare, transportation, entertainment, household management, etc.

Mixed-reality computer systems, including virtual-reality systems and augmented-reality systems, have recently received significant interest for their ability to create immersive experiences for users. Conventional augmented-reality systems create an augmented reality scenario by visually presenting virtual objects in the real world. In contrast, conventional virtual-reality systems create a more immersive experience such that a user's entire view is obstructed by a virtual world. As used herein, mixed-reality, augmented-reality, and virtual-reality systems are described and referenced interchangeably. In general, however, "mixed-reality" will be used to broadly describe the various technologies. Unless specifically stated or unless specifically required, as understood by one of skill in the art, the descriptions herein apply equally to any type of mixed-reality system, including augmented-reality systems, virtual-reality systems, and/or any other similar system capable of displaying virtual objects to a user.

Continued advances in hardware capabilities and rendering technologies have greatly increased the realism of virtual objects and scenes displayed to a user within a mixed-reality environment. For example, in mixed-reality environments, virtual objects can be placed within the real world in such a way as to give the impression that the virtual object is part of the real world. As a user moves around within the real world, the mixed-reality environment automatically updates so that the user is provided with the proper perspective and view of the virtual object; this mixed-reality environment is referred to as a scene.

Immersing a user into a mixed-reality environment creates many challenges and difficulties that extend beyond the mere presentation of a scenario to a user. For example, there is significant interest in the field regarding technologies that allow a user to interact with virtual objects in a mixed-reality scenario. Various systems and methods are used to provide this interactive ability to the users.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein include a computer system for dynamically switching modes within a magnetic sensor device. The computer system communicates through a secondary communication channel with a first magnetic sensor device and a second magnetic sensor device. The first magnetic sensor device includes at least a magnetic signal receiving functionality. The computer system determines that the second magnetic sensor device includes magnetic signal transmitting functionality and magnetic signal receiving functionality. After determining that the second magnetic sensor device includes magnetic signal transmitting functionality, the computer system causes the second magnetic sensor device to begin transmitting a first magnetic field signal.

At least one embodiment of a method for dynamically switching modes within a magnetic sensor device includes communicating through a secondary communication channel with a plurality of magnetic sensor devices. A first magnetic sensor device within the plurality of magnetic sensor devices includes magnetic signal transmitting functionality and magnetic signal receiving functionality. The method also includes receiving information associated with at least a portion of the plurality of magnetic sensor devices. The information comprises sensor-specific characteristics. Additionally, the method includes calculating a magnetic sensor device plan based upon the information. Further, the method includes based upon the magnetic sensor device plan, causing the first magnetic sensor device to activate magnetic signal transmitting functionality.

This Summary is provided to introduce a selection of concepts in a simplified form that are further described below in the Detailed Description. This Summary is not intended to identify key features or essential features of the claimed subject matter, not is it intended to be used as an aid in determining the scope of the claimed subject matter.

Additional features and advantages will be set forth in the description that follows, and in part will be obvious from the description, or may be learned by the practice of the teachings contained herein. Features and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Embodiments disclosed herein include systems, computer-readable media, and methods for dynamically switching modes within a magnetic sensor device. In at least one disclosed embodiment, a mixed-reality system communicates through a secondary communication channel with one or more magnetic sensor devices. Using data received through the secondary communication channel, the mixed-reality system is able to cause the mode of various magnetic sensor devices to switch. For example, the mixed-reality system may case a magnetic sensor device to switch from a transmission mode to a receiver mode.

As used herein, a secondary communication channel comprises a communication channel other than a channel used for measurement of a magnetic field to determine pose. For example, the secondary communication channel may comprise BLUETOOTH, WIFI, or any other communication standard that allows for the two-way transfer of data. Additionally, as used herein a magnetic sensor device comprises a device that is capable of emitting and/or receiving magnetic field signals. Additionally, as used herein, "magnetic-sensor devices" and "on-body devices" are used interchangeably. More specifically, on-body devices are used as examples of magnetic sensor devices that can be configured to perform various embodiments disclosed herein. One will appreciate that the scope of embodiments disclosed herein is not limited to particular forms or devices, but can, instead, be implemented in a variety of different embodiments that extend beyond on-body devices.

Accordingly, the embodiments described herein overcome many deficiencies prevalent throughout the conventional technology. For example, disclosed embodiments provide systems, methods, and apparatuses that dynamically adjust the mode of one or more magnetic sensor devices to meet the needs of the environment or the needs of a particular configuration. As such, disclosed embodiments provide greater flexibility in their pose estimations than would otherwise be possible. Further, these embodiments provide for many other substantial benefits that will be described throughout the remainder of this disclosure.

The following discussion may refer to a number of methods and method acts that may be performed. Although the method acts may be discussed in a certain order or illustrated in a flow chart as occurring in a particular order, no particular ordering is required unless specifically stated, or required, because an act is dependent on another act being completed prior to the act being performed.

Figure 1:
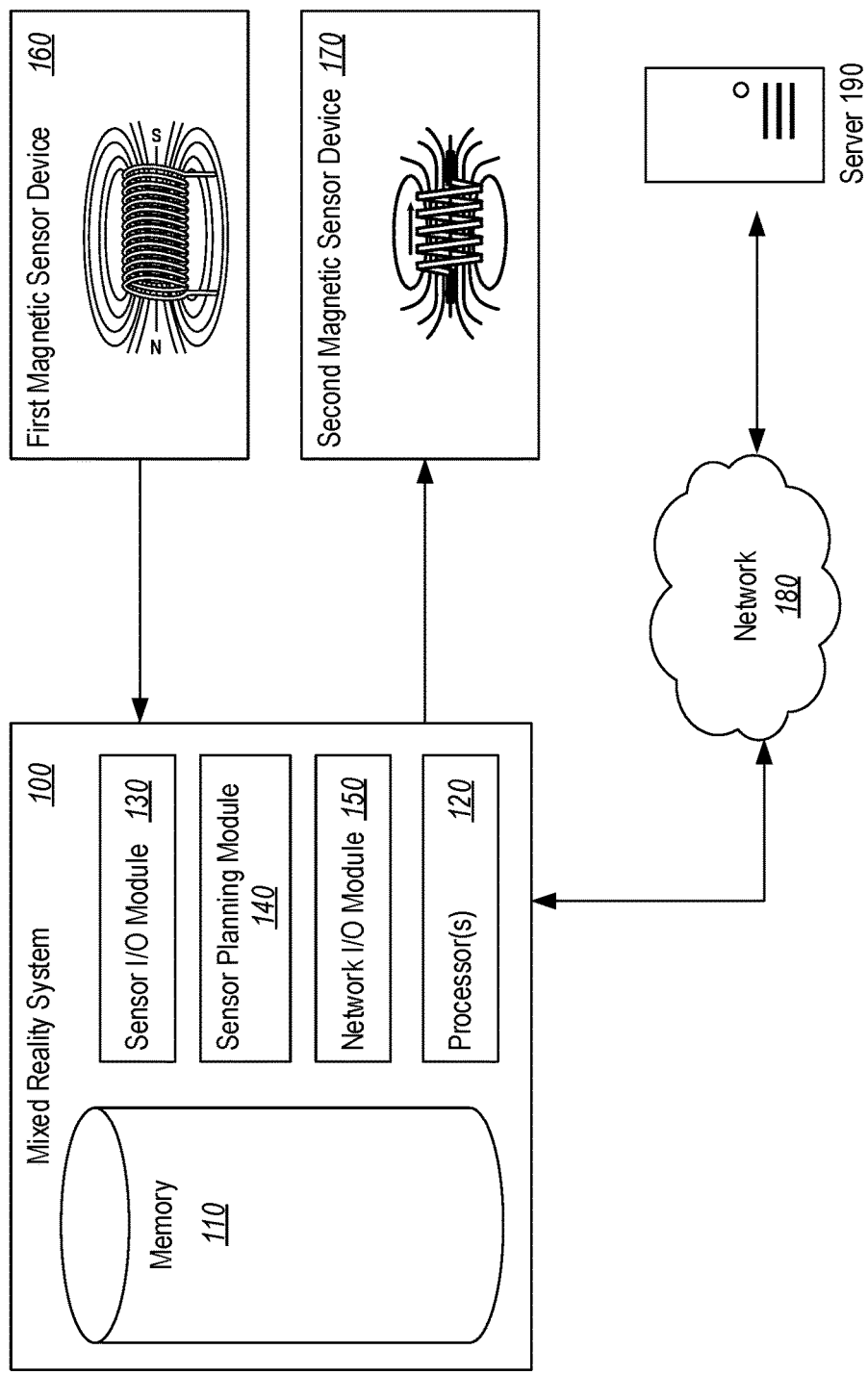
FIG. 1 illustrates a schematic diagram of an embodiment of a mixed-reality system and associated devices.

Initially, FIG. 1 illustrates a schematic diagram of an embodiment of a mixed-reality system 100 that is in communication with a first magnetic sensor device 160, a second magnetic sensor device 170, a network 180, and a server 190. One will appreciate that the various modules, components, and devices shown in FIG. 1 and throughout this application are provided for the sake of example and explanation. In additional or alternate embodiments, the mixed-reality system 100 may include a different combination of modules, components, and devices.

The depicted mixed-reality system 100 includes one or more processor(s) 120 and memory 110. The one or more processor(s) 120 and memory 110 may be representative of hardware components and/or software components. The mixed-reality system 100 also includes a sensor I/O module 130, a sensor planning module 140, and a network I/O module 150. In at least one embodiment, the sensor I/O module 130 communicates with one or more input devices that provide sensor information useful for generating a mixed-reality environment. The one or more input devices comprise first magnetic sensor device 160 and second magnetic sensor device 170. The first magnetic sensor device 160 and the second magnetic sensor device 170 are configured to track a pose of a user within a mixed-reality environment. The sensor I/O module 130 may also communicate with one or more cameras, depth sensors, LIDARs, accelerometers, gyroscopes, sonars, and any other sensors useful within a mixed-reality environment.

The first magnetic sensor device 160 may be embedded within a mixed-reality headset and the second magnetic sensor device 170 may be embedded within a handheld controller. As the user moves the handheld controller around within the mixed-reality environment, the mixed-reality system 100 causes the first magnetic sensor device 160 to transmit a known magnetic field signal. The mixed-reality system 100 also causes the second magnetic sensor device 170, within the handheld controller, to measure variations in the magnetic field signal as the handheld controller is moved between different positions. The second magnetic sensor device 170 communicates these measured variations to the sensor I/O module 130. The one or more processor(s) 120 are then able to determine the relative measured variations. One will appreciate that in at least one embodiment the second magnetic sensor device 170 generates magnetic field signals that the first magnetic sensor device 160 receives.

In various additional or alternative embodiments, the mixed-reality system 100 also utilizes other sensor devices to track the relative pose of the user within the mixed-reality environment. For example, the mixed-reality system 100 may utilize a camera to track the pose of the handheld controller with respect to the mixed-reality headset. For example, whenever the handheld controller is within the field-of-view of the camera, the camera may track specific points (e.g., reflectors) that are placed on the handheld controller. Similarly, the handheld controller may comprise an inertial measurement unit ("IMU") that is able to also provide motion and tracking data relating to the handheld controller. The mixed-reality system 100 is capable of choosing to rely upon a particular sensor for computing pose or to rely upon a combination of multiple sensors to compute pose.

As will be explained more fully below, in at least one embodiment, the network I/O module 150 communicates with the server 190 through a network 180. The network I/O module 150 receives data that is associated with the particular mixed-reality environment that the user is within and, in some cases, receives data related to other mixed-reality systems that are in the vicinity of mixed-reality system 100. For example, the mixed-reality system 100 may receive an indication that another mixed-reality system is being used in the same room. The indication may also comprise information about the current state of the other mixed-reality system's sensors and communication states. Using this information, the mixed-reality system 100 can cause the state of various magnetic sensor devices to switch, in order to optimize performance.

In at least one embodiment, the sensor planning module 140 calculates plans for how to optimize the use of magnetic sensor devices. As will be explained more fully below, in various embodiments it may be desirable to adjust the state of one or more magnetic sensor devices in order to optimize various performance attributes.

Figure 2:
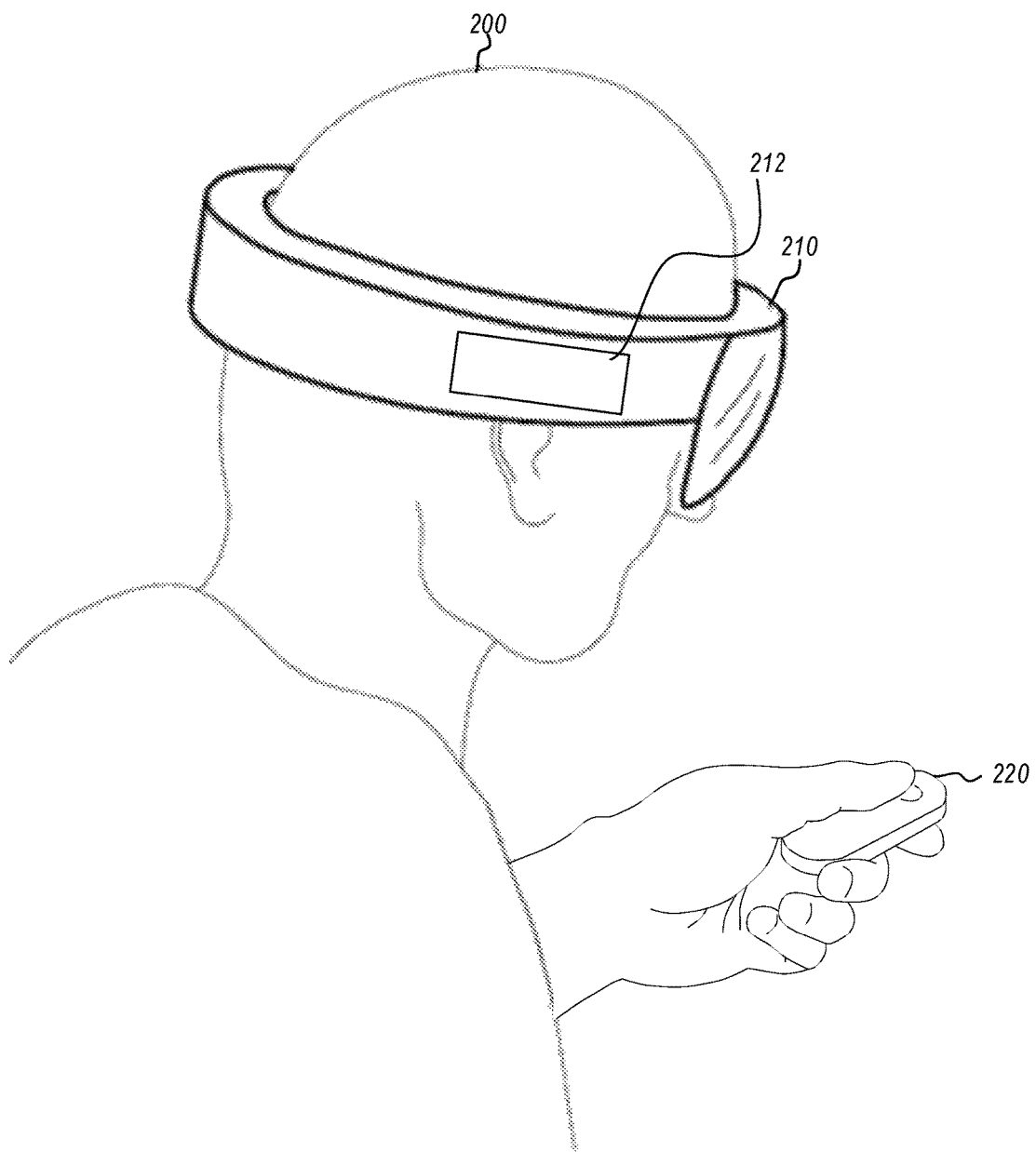
FIG. 2 illustrates an embodiment of mixed-reality devices being used by a user.

FIG. 2 illustrates an embodiment of mixed-reality devices being used by a user 200. The mixed-reality system 100 depicted in FIG. 2 includes a head-mounted display ("HMD") 210 positioned on a user 200. In the depicted embodiment, the HMD 210 is associated with a mixed-realty system 100 like that described in FIG. 1. Additionally, the HMD 210 includes at least one sensor unit 212 that gathers sensor information relating to the mixed-reality environment. One of skill in the art will recognize that the depicted system can analogously be used within mixed-reality, augmented reality, virtual reality, or any other similar endeavor.

FIG. 2 also depicts a handheld controller 220. Although FIG. 2 illustrates only a single handheld controller 220, embodiments of the present invention are not limited solely to those devices depicted in FIG. 2. For instance, embodiments of the present invention can be configured to simultaneously utilize many on-body devices. Even further, the on-body devices need not merely be handheld or head-mounted. For instance, embodiments of the present invention can be configured to utilize any type of on-body device (e.g., a device mounted on a user's foot, a device mounted on a user's torso, etc.). Additionally, embodiments disclosed herein can also be practiced outside of mixed-reality environments. For example, a user may control a conventional computer using systems, methods, and apparatuses disclosed herein.

The handheld controller 220 may include one or more IMUs. By manipulating the handheld controller 220, the user 200 can interact with the mixed-reality environment and provide user input to the HMD 210. This input can include, for example, controlling and moving virtual objects included within the mixed-reality scenario. A wide variety of user input can be provided. Accordingly, FIG. 2 presents a wearable mixed-reality system 100 that utilizes handheld and head-mounted devices. Together, these devices (i.e. the HMD 210 and the handheld controller 220) enable a user to precisely and rapidly control the mixed-reality computing system.

On-body devices, such as the handheld controller 220 depicted in FIG. 2, can use a magnetic field signal to allow measurement of the pose of the handheld controller 220 with respect to a sensor unit 212 in the HMD 210. In at least one embodiment, the magnetic field signal, the HMD 210, and the handheld controller 220 work in unison to determine how the handheld controller 220 is oriented/situated in relation to the HMD 210 (i.e. its "pose"). Determining the handheld device's pose with respect to the HMD 210 enhances the mixed-reality scenario that is presented to the user 200.

For instance, suppose the mixed-reality computing system 100 presents a scenario in which a user 200 has a virtual object (e.g., a gun, laser, watch, etc.) attached to his/her arm. This scenario may be designed to allow the user 200 to use the virtual object to advance through stages of the scenario (e.g., perhaps the user is to use the gun to fight villains). As a result, the user 200 will move and interact with the images depicted in the scenario. The virtual object should move in unison with the user's movements. Indeed, to provide an enhanced experience, the virtual object should follow the user's specific arm movements. Accordingly, accurate pose positioning of the virtual object (which is accomplished through the communications between the HMD 210 and the handheld controller 220) will better enable the user 200 to advance through the various stages of the scenario.

Figure 3:
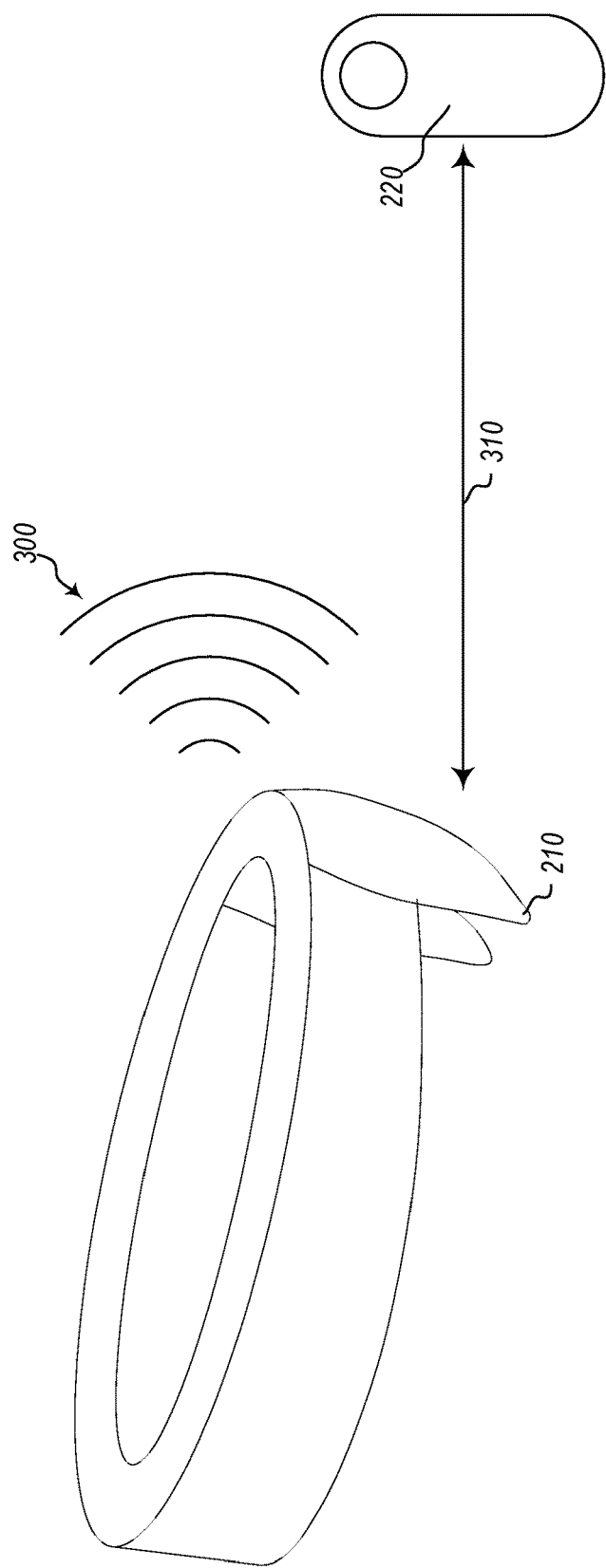
FIG. 3 illustrates a schematic diagram of an embodiment of mixed-reality devices communicating with each other.

FIG. 3 provides a high-level overview of how the mixed-reality computing system determines an on-body device's pose. For instance, FIG. 3 illustrates a schematic diagram of an embodiment of mixed-reality devices communicating with each other. As depicted, the mixed-reality system 100 operates by having at least one of the on-body devices (e.g., the HMD 210) transmit a magnetic field signal 300. While the HMD 210 is transmitting the magnetic field signal 300, a different device (e.g., the handheld controller 220) will measure the received magnetic field signal. The pose of the on-body device (e.g., the handheld controller 220) can then be computed using the near field fall off relationship and the measured indication from the plurality of magnetic field signals 300.

FIG. 3 also illustrates that a secondary communication channel 310 can be maintained between the two devices. The secondary communication channel 310 is used to communicate data between the two devices and to synchronize other communications between the various devices of the mixed-reality system 100. The secondary communication channel 310 may be different than the channels used to transmit the magnetic field signal. For instance, the secondary communication channel 310 can be in the form of a BLUETOOTH™ channel.

Figure 4:
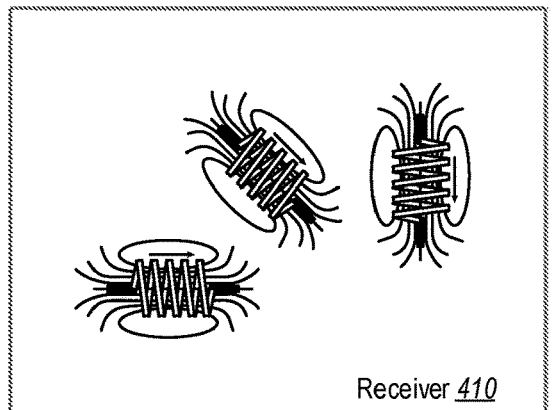
FIG. 4 illustrates a schematic diagram of another embodiment of mixed-reality devices communicating with each other.
Figure 4:
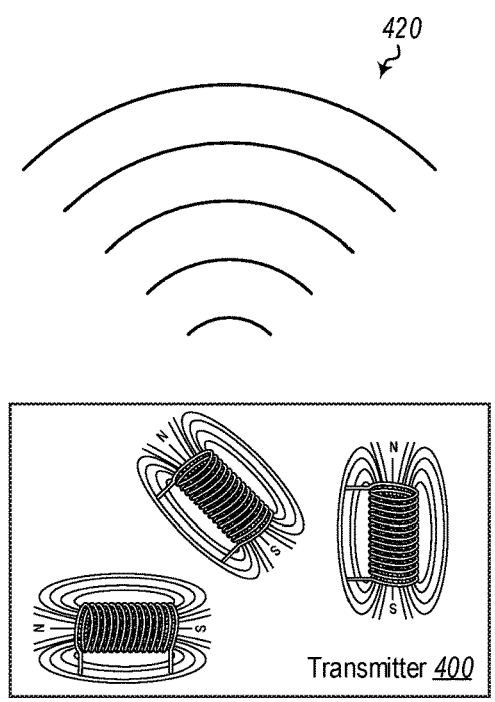

FIG. 4 presents an alternative depiction of the devices of a mixed-reality system 100. For instance, FIG. 4 illustrates a schematic diagram of another embodiment of mixed-reality devices communicating with each other. In particular, a transmitter 400 is depicted emitting a magnetic field signal 420 to a receiver 410. The transmitter 400 may be embedded within an HMD 210. The receiver 410 may be embedded within a handheld controller 220. In at least one additional or alternative embodiment, the HMD 210 and/or the handheld controller 220 comprises magnetic transceivers that are capable of both emitting and receiving magnetic field signals.

Although not shown in the figures, the HMD 210 (and even the other on-body devices) may include other sensors as well. To illustrate, the HMD 210 can include one or more cameras (e.g., color and/or black and white), depth sensors, infrared sensors, accelerometers, gyroscopes, magnetometers, etc. These other sensors can be used for a variety of reasons. By way of example and not limitation, the sensors of the mixed-reality system 100 can be used to detect objects in an environment in which the system is being operated. Not only can the mixed-reality system 100 use the sensors to detect the objects, the mixed-reality system 100 can also use the sensors in an attempt to identify what those objects actually are.

For instance, suppose the user 200 from FIG. 2 was using the mixed-reality system 100 in a living room. Most living rooms have a variety of objects included therein (e.g., couches, tables, lamps, etc.). Using its sensors, the mixed-reality system 100 detects and identifies those living room objects. Even further, the mixed-reality system 100 can use those objects to develop and present a mixed-reality scenario to the user 200 (e.g., the mixed-reality system 100 can show the couch as being on fire, or a villain breaking through a wall).

As suggested above, the on-body devices (e.g., the handheld controller 220 from FIG. 2) can also include these sensors. As a result, the HMD 210 and the various on-body devices can be used to understand the environment and to create a working model of that environment. Once this model is created, the mixed-reality system 100 tracks the objects and uses the environment to create a better mixed-reality scenario. As indicated before, a depth sensor can be used to understand the depth of objects in the environment and can facilitate in the process of identifying what those objects are. Accordingly, using its sensors, a mixed-reality system 100 can generate a working model of an environment and use that model to enhance any mixed-reality scenarios.

While the above discussion focused on the use of on-body devices (e.g., the HMD 210 and handheld device 220) to transmit and receive the magnetic field signal, different embodiments of the present invention can utilize other devices to transmit and receive the magnetic field signal. Indeed, some situations may desire greater flexibility in determining which devices are used to transmit or receive the magnetic field signal. For instance, instead of an on-body device or the HMD 210 transmitting the magnetic field signal, a tablet or other computing system may be used to transmit the signal.

For example, a user within a mixed-reality environment may be using a drafting program to design an engine. At different portions of the design process, it may be beneficial to seamlessly switch from interacting with a three-dimensional model within the mixed-reality environment to working on the computer in a two-dimensional model. In at least one embodiment, a handheld controller 220 transmits magnetic field signals to an HMD 210 while the user is working on the three-dimensional model. The handheld controller 220 then automatically begins to receive magnetic field signals generated by the computer when the user is working on the two-dimensional model. As such, the user can utilize the same handheld controller 220 to interact with both the three-dimensional model via the HMD 210 and the two-dimensional model on the computer.

Figure 5:
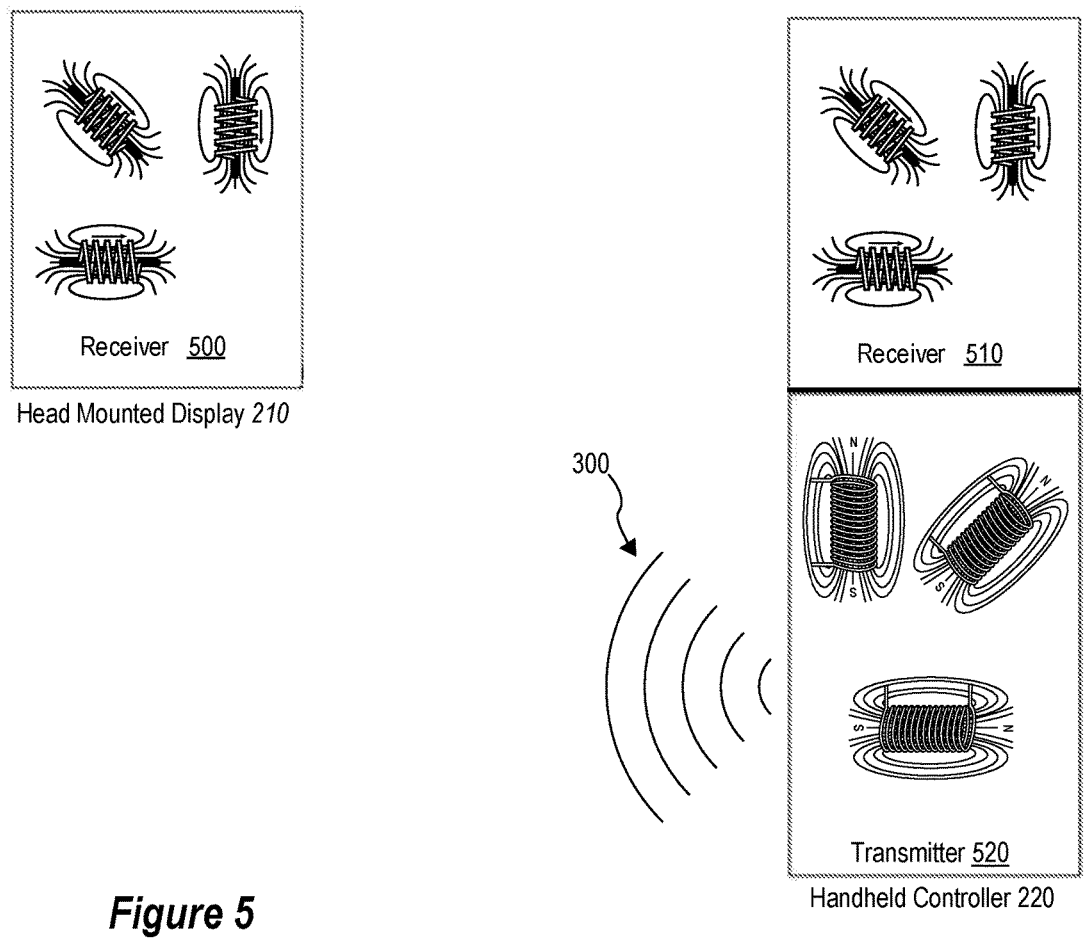
FIG. 5 illustrates a schematic diagram of yet another embodiment of mixed-reality devices communicating with each other.

FIG. 5 illustrates a schematic diagram of yet another embodiment of mixed-reality devices communicating with each other. In particular, FIG. 5 depicts a schematic view of a magnetic sensor device from an HMD 220 in communication with a magnetic sensor device from a handheld controller 210. As depicted the magnetic sensor device in the HMD 210 comprises a receiver 500, while the magnetic sensor device in the handheld controller 220 comprises a receiver 510 and a transmitter 520. One will appreciate that the schematic diagram depicted in FIG. 5 is provided only for the sake of example and explanation. In various embodiments, the magnetic sensor devices may be disposed within other systems and may comprise different configurations.

In at least one embodiment, the coils of the transmitter 520 are different than the coils in the receiver 510. In contrast, in at least one additional or alternative embodiment, the receiver 510 and transmitter 520 of the handheld controller 220 comprise a single magnetic transceiver unit that is capable of both transmitting and receiving magnetic field signals. Accordingly, a variety of different magnetic sensor device configurations are capable of switching between magnetic signal transmitting functionality and magnetic signal receiving functionality.

In at least one embodiment, the mixed-reality system 100 communicates through a secondary communication channel (e.g., 310 shown in FIG. 3) with a first magnetic sensor device (e.g., head mounted display 210) and a second magnetic sensor device (e.g., handheld controller 220). As depicted, the head mounted display 210 includes at least a magnetic signal receiving functionality. Through the secondary communication channel 310, the mixed-reality system 100 determines that the handheld controller 220 includes both magnetic signal transmitting functionality and magnetic signal receiving functionality.

After determining that the handheld controller 220 includes magnetic signal transmitting functionality, the mixed-reality system 100 causes the handheld controller 220 to begin transmitting a first magnetic field signal 300. Once the head mounted display 210 receives the first device magnetic field signal 300 transmitted from the handheld controller 220, the mixed-reality system 100 notifies the handheld controller 220 via the secondary communication channel 310 that the first magnetic field signal was successfully received.

By utilizing the secondary communication channel and the ability of one or more magnetic sensor devices to switch between magnetic signal transmitting functionality and magnetic signal receiving functionality, the mixed-reality system 100 is able to optimize its own operating conditions. For example, the mixed-reality system 100 may cause a magnetic sensor device with a lower battery level than another magnetic sensor device to switch from a magnetic signal transmitting functionality to a magnetic signal receiving functionality in order to conserve power. Additionally, the mixed-reality system 100 may cause a magnetic sensor device to switch from a magnetic signal transmitting functionality to a magnetic signal receiving functionality in order to reduce channel congestion in a mixed-reality environment.

Figure 6A:
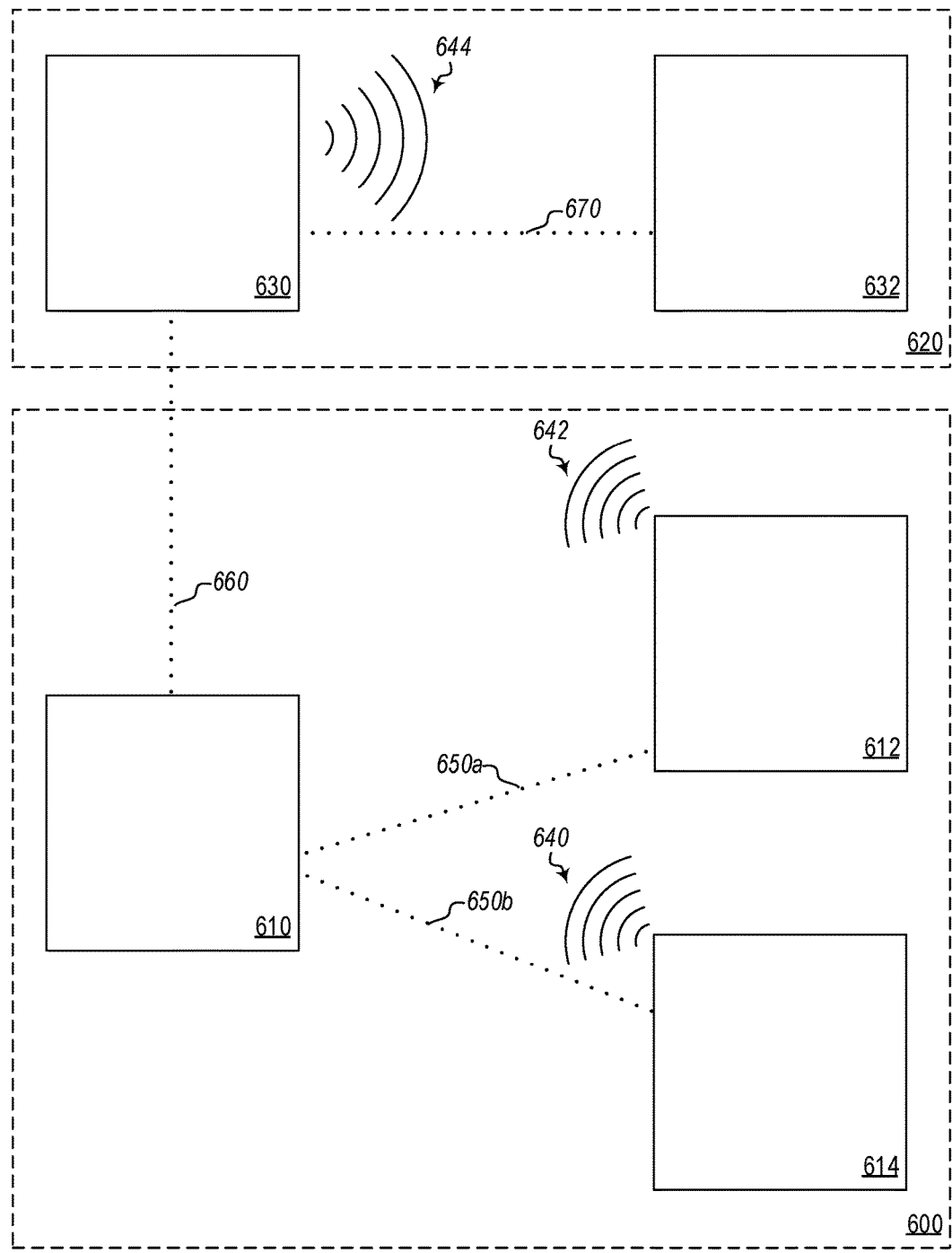
FIG. 6A illustrates a schematic diagram of an embodiment of two different mixed-reality systems communicating with each other.

For example, FIG. 6A illustrates a schematic diagram of an embodiment of two different mixed-reality systems 600, 620 communicating with each other through the secondary communication channel 660. Mixed-reality system 600 comprises three different magnetic sensor devices 610, 612, 614. Magnetic sensor devices 612, 614 are transmitting respective magnetic field signals 640, 642, which are detected by magnetic sensor device 610. Magnetic sensor device 610 is in communication with magnetic sensor devices 612, 614 through secondary communication channels 650*a*, 650*b*.

Mixed-reality system 620 comprises two different magnetic sensor devices 630, 632. Magnetic sensor device 630 transmits magnetic field signal 644, which is detected by magnetic sensor device 632. Magnetic sensor device 630 is in communication with magnetic sensor device 632 through secondary communication channel 670. In at least one embodiment, the secondary communication channel 670 is the same type of secondary communication channel 310 used between magnetic sensor devices within a mixed-reality system 600, 620. In contrast, in at least one embodiment, the secondary communication channel may comprise a variety of different communication channel types between different components.

In at least one embodiment, mixed-reality system 600 detects one or more magnetic sensor devices (e.g., magnetic sensor device 630) associated with mixed-reality system 620. In at least one additional or alternative embodiment, mixed-reality system 600 detects the one or more magnetic sensor devices by detecting a magnetic sensor device from mixed-reality system 620 that is transmitting a magnetic field signal. In contrast, in at least one additional or alternative embodiment, the mixed-reality system 600 detects the magnetic sensor devices by communication with mixed-reality system 620 through the secondary communication channel 660.

In at least one embodiment, mixed-reality system 600 communicates with a processing unit in the mixed-reality system 620 through the secondary communication channel 660 in order to receive information, such as information relating to the one or more magnetic sensor devices 630, 632. The information comprises sensor-specific characteristics, such as communication and reception abilities, current signal-to-noise ration ("SNR") figures, power source data, and other similar information. In the depicted embodiment, mixed-reality system 600 receives information that indicates that both magnetic sensor devices 630, 632 comprise magnetic signal transmitting functionality and magnetic signal receiving functionality. Additionally, mixed-reality system 600 may receive information regarding the type of power sources that each magnetic sensor devices 630, 632 is associated with. For example, this information may indicate whether a particular magnetic sensor device is connected to a power outlet or the expected battery life associated with a magnetic sensor device 630, 632 within the mixed-reality system 620.

Based upon the received information, mixed-reality system 600 calculates a magnetic sensor device plan. For example, sensor planning module 140 (shown in FIG. 1) calculates a plan for best utilizing the available magnetic sensor devices 610, 612, 614, 630, 632. The magnetic sensor plan may be influenced by a user or administrator to optimize for specific characteristics. For example, the magnetic sensor plan may be generated to maximize a cumulative battery life of the magnetic sensor devices 610, 612, 614 within the mixed-reality system 600 and/or to maximize the cumulative battery life of multiple related mixed-reality systems 600, 620. Similarly, the received information may indicate that magnetic sensor device 612 is connected to a battery with a current charge level that comprises a charge level that is below a pre-defined threshold. This may cause the mixed-reality system 600 to switch magnetic sensor device 612 to the less power intensive magnetic signal receiving functionality.

Additionally, the magnetic sensor plan may be configured to optimize signal strength within a single mixed-reality system 600 or increase the average signal to noise ratio between multiple mixed-reality systems 600, 620. For example, a mixed-reality system 600 is capable of causing at least one of its magnetic sensor devices 612, 614 to deactivate magnetic signal transmitting functionality and activate magnetic signal receiving functionality. For instance, the received information and/or information gathered by mixed-reality system 600 may indicate that the magnetic communication channels are becoming overly crowded or that the signal to noise ratio is otherwise diminishing. In response, the mixed-reality system 600 may attempt to reduce the number of different magnetic sensor devices that are using their magnetic signal transmitting functionalities.

Figure 6B:
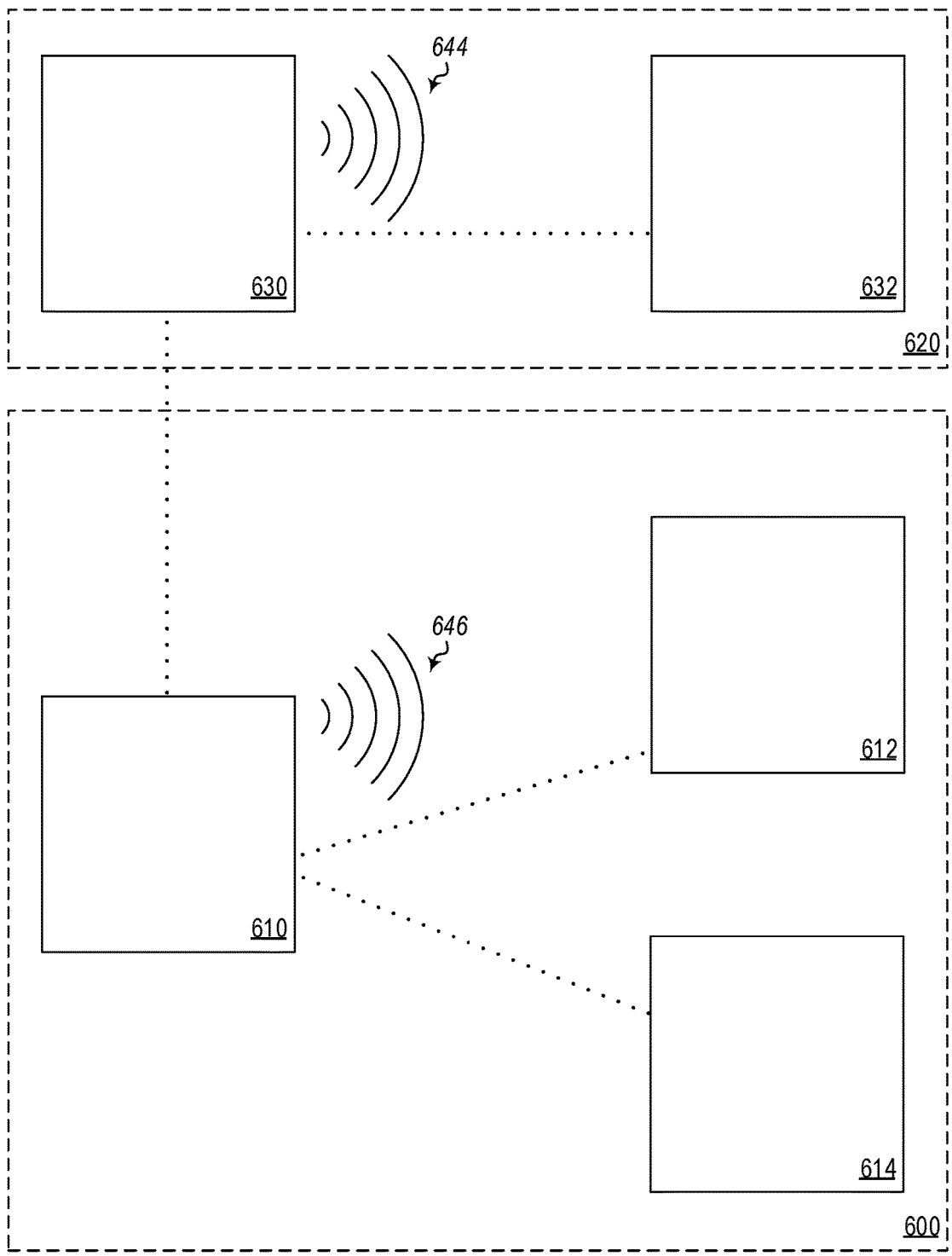
FIG. 6B illustrates a schematic diagram of another embodiment of the two mixed-reality systems depicted in FIG. 6A communicating with each other.

For example, FIG. 6B illustrates a schematic diagram of another embodiment of the two mixed-reality systems 600, 620 depicted in FIG. 6A communicating with each other. In FIG. 6B, the magnetic sensor devices 612, 614 have stopped transmitting their respective magnetic field signals 640, 642 and are instead receiving magnetic field signal 646 from magnetic sensor device 610, which has activated its magnetic signal transmitting functionality. As such, compared to the mixed-reality system configuration for FIG. 6A where three different magnetic sensor devices 612, 614, 630 are using their magnetic signal transmitting functionalities, in FIG. 6B only two magnetic sensor devices 610, 630 are using their magnetic signal transmitting functionalities. As such, the overall usage of bandwidth has been reduced by thirty percent. Along with reducing bandwidth congestion, noise may also be similarly reduced within the magnetic communication channels.

Figure 7:
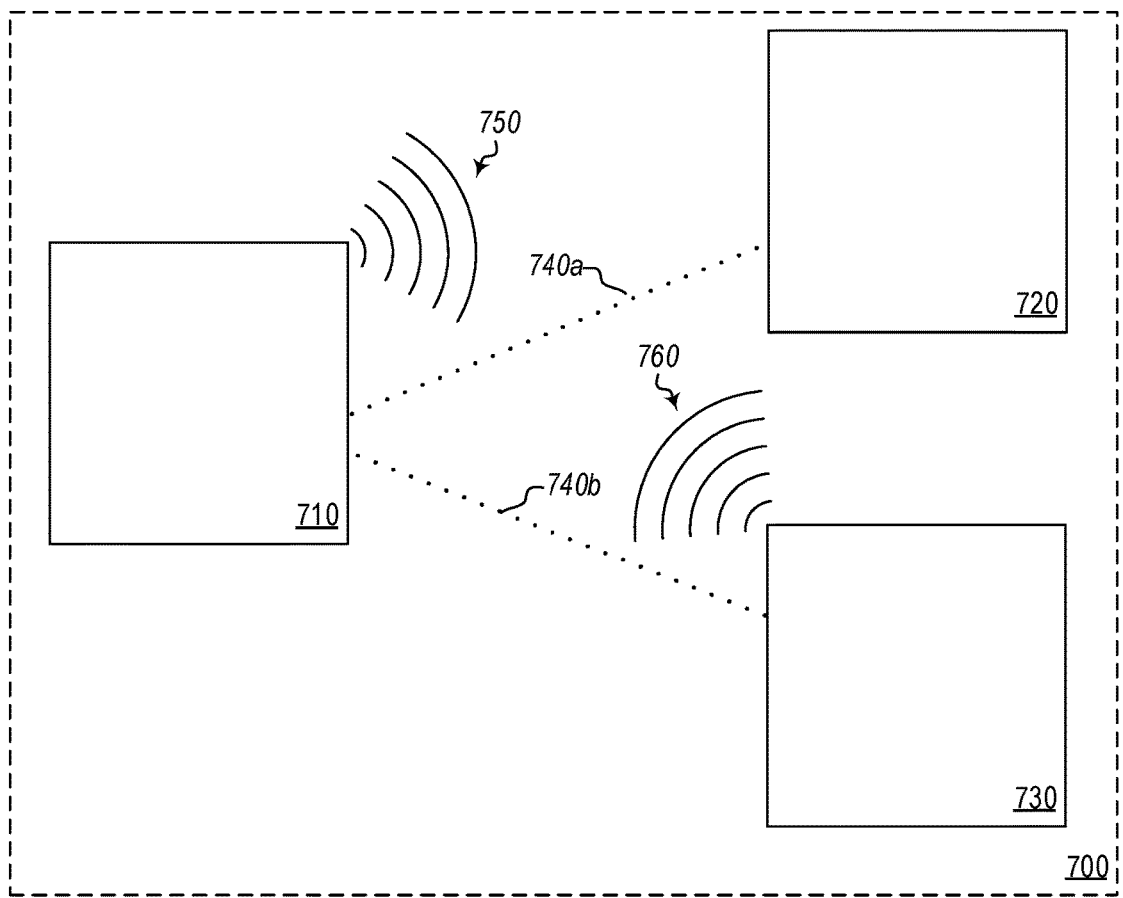
FIG. 7 illustrates a schematic diagram of another embodiment of mixed-reality devices communicating with each other.

In at least one embodiment, a magnetic sensor device is capable of acting simultaneously with both magnetic signal transmitting functionality and magnetic signal receiving functionality. For example, FIG. 7 illustrates a schematic diagram of another embodiment of mixed-reality devices communicating with each other. In at least one embodiment, magnetic sensor device 710 communicates with magnetic sensor devices 720 and 730 through secondary communication channels 740(*a*, *b*). In particular, in at least one embodiment, magnetic sensor device 710 determines that magnetic sensor device 720 includes magnetic signal receiving functionality. After determining that the magnetic sensor device 720 includes magnetic signal receiving functionality, the mixed-reality system causes the magnetic sensor device 720 to begin receiving a magnetic field signal 750 generated by the magnetic sensor device 710. After magnetic sensor device 720 receives the magnetic field signal 750 transmitted from magnetic sensor device 710, magnetic sensor device 720 notifies magnetic sensor device 710, via the secondary communication channel 740*a*, that the magnetic field signal 750 was successfully received. Accordingly, in at least one embodiment, magnetic sensor device 710 receives a first magnetic field signal 760 from magnetic sensor device 730, while at the same time transmitting a magnetic field signal 750 to magnetic sensor device 720.

As described above, the magnetic sensor devices 710, 720, 730 of mixed-reality system 700 may be incorporated into a variety of different mixed-reality devices. For example, in at least one embodiment, magnetic sensor device 710 is disposed within an HMD, magnetic sensor device 720 is disposed within a first handheld controller that is in communication within the HMD, and magnetic sensor device 730 is disposed within a second handheld controller that is in communication within the first head mounted display. One will understand that as used herein when describing various magnetic sensor devices communicating with each other, it is not necessary that the secondary communication channels 740(*a*, *b*) be directly between the respective magnetic sensor devices 710, 720, 730. Instead, the magnetic sensor devices 710, 720, 730 may communicate to a network I/O module 150 within the mixed-reality system 100 (as shown in FIG. 1). The network I/O module 150 forwards the communications to the one or more processors 120, which process the information and forward any resulting commands to the individual magnetic sensor devices.

In at least one embodiment, over time the mixed-reality system 100 receives updated information from the various magnetic sensor devices. Using this information, the sensor planning module 140 is able to update a magnetic sensor device plan and cause the magnetic sensor devices to change functionality states as required.

Now, an exemplary method of dynamically switching modes within a magnetic sensor device will be described with respect to FIG. 8.

Figure 8:
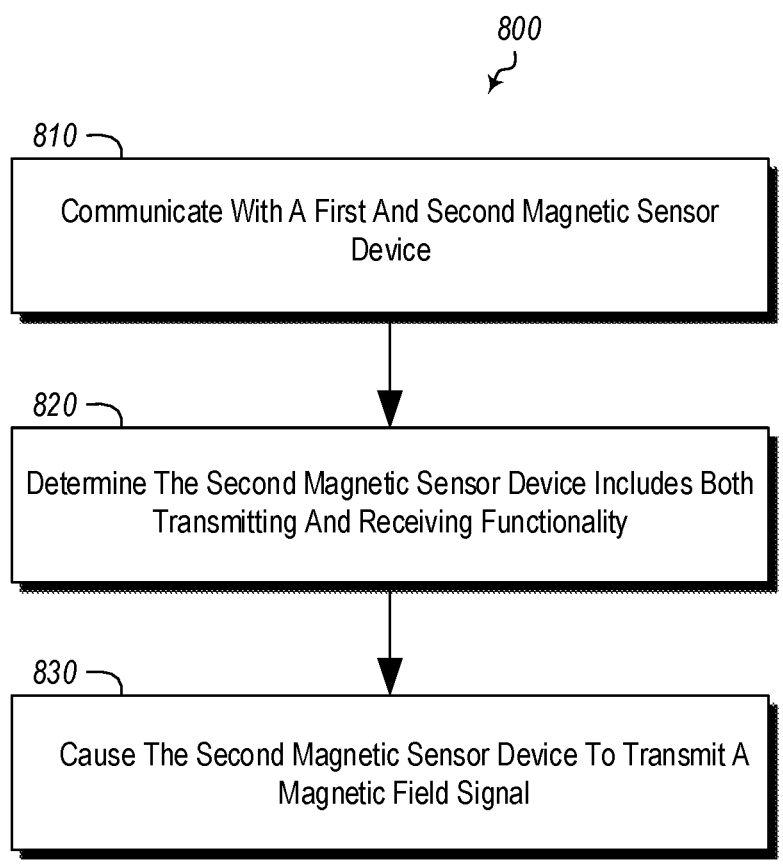
FIG. 8 illustrates steps in an exemplary method that can be followed to dynamically switch modes within a magnetic sensor device.

FIG. 8 illustrates steps in an exemplary method 800 that can be followed to dynamically switch modes within a magnetic sensor device. For example, FIG. 8 illustrates that method 800 includes an act 810 for communicating with a first and second magnetic sensor device. Act 810 comprises communicating through a secondary communication channel with a first magnetic sensor device and a second magnetic sensor device, wherein the first magnetic sensor device includes at least a magnetic signal receiving functionality. For example, as illustrated and described with respect to FIG. 3, an HMD 210 may comprise a magnetic sensor device and a handheld controller 220 may comprise another magnetic sensor device. The respective devices 210, 220 communicate with each other through secondary communication channel 310.

Method 800 also includes an act 820 of determining that the second magnetic sensor device includes both transmitting and receiving functionality. Act 820 comprises determining that the second magnetic sensor device includes magnetic signal transmitting functionality and magnetic signal receiving functionality. For example, as depicted and described with respect to FIG. 5, the handheld controller 220 includes both a receiver 510 and a transmitter 520. The transmitter 520 provides magnetic signal transmitting functionality and the receiver 510 provides magnetic signal receiving functionality.

Additionally, method 800 includes an act 830 of causing the second magnetic sensor device to transmit a magnetic field signal 830. Act 830 comprises after determining that the second magnetic sensor device includes magnetic signal transmitting functionality, causing the second magnetic sensor device to begin transmitting a first magnetic field signal. For example, as depicted and described with respect to FIGS. 6A and 6B, mixed-reality system 600 determines that magnetic sensor device 610 comprises magnetic signal transmitting functionality. Based upon this determination, the mixed-reality system 100 causes magnetic sensor device 610 to transmit a magnetic sensor field 646.

Figure 9:
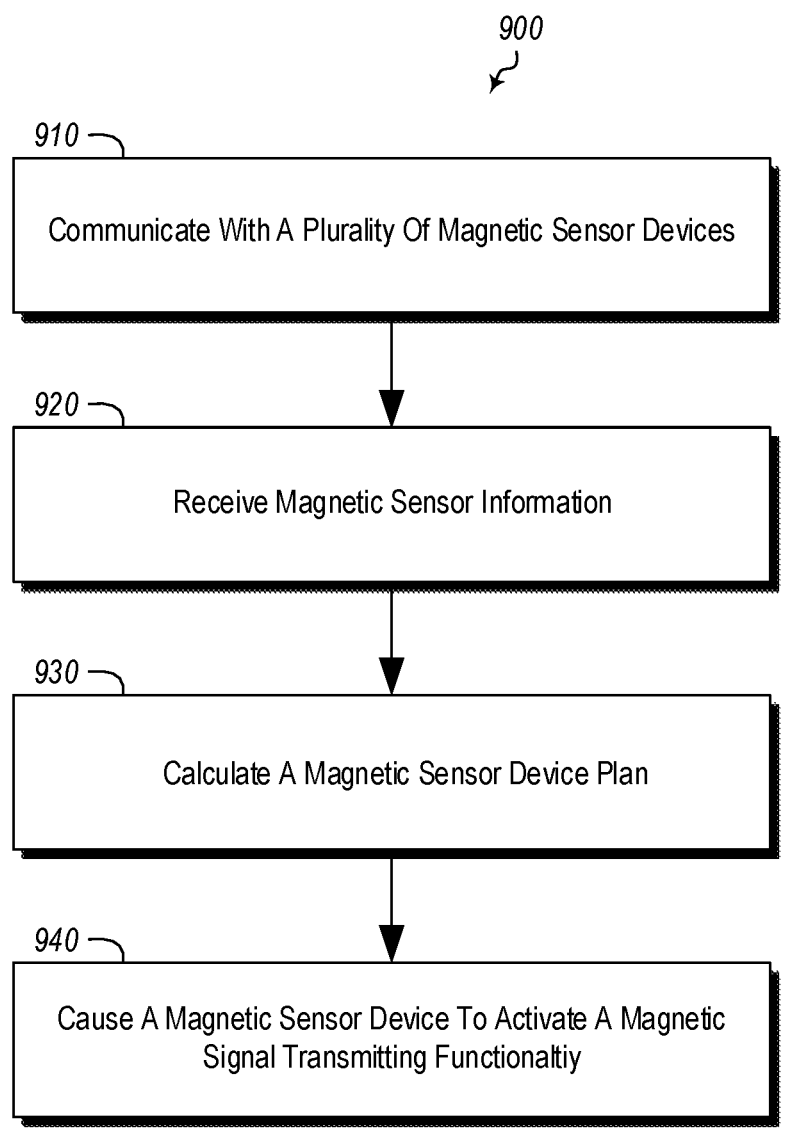
FIG. 9 illustrates steps in another exemplary method that can be followed to dynamically switch modes within a magnetic sensor device.

Additional embodiments of methods can be used to dynamically switch modes within a magnetic sensor device. For example, FIG. 9 illustrates steps in another exemplary method 900 that can be followed to dynamically switch modes within a magnetic sensor device. Method 900 includes an act 910 of communicating with a plurality of magnetic sensor devices. Act 910 includes communicating through a secondary communication channel with a plurality of magnetic sensor devices, wherein a first magnetic sensor device within the plurality of magnetic sensor devices includes magnetic signal transmitting functionality and magnetic signal receiving functionality. For example, as illustrated and described with respect to FIG. 3 and FIG. 5, an HMD 210 may comprise a receiver, and a handheld controller 220 may comprise both a receiver 510 and a transmitter 520. The respective devices 210, 220 communicate with each other through secondary communication channel 310.

Additionally, method 900 includes an act 920 of receiving magnetic sensor information. Act 920 comprises receiving information associated with at least a portion of the plurality of magnetic sensor devices, wherein the information comprises sensor-specific characteristics. For example, as depicted and described with respect to FIGS. 6A and 6B, mixed-reality system 600 receives information through the secondary communication channels 650(*a*, *b*), 660 that describe sensor-specific characteristics about each magnetic sensor device 610, 612 614.

Method 900 also includes an act 930 of calculating a magnetic sensor device plan 930. Act 930 comprises calculating a magnetic sensor device plan based upon the information. For example, as depicted and described with respect to FIGS. 6A and 6B, a sensor planning module 140 associated with mixed-reality system 600 may calculate a magnetic sensor plan that is configured to minimize noise between both mixed-reality systems 600, 620.

Further, method 900 includes an act 940 of causing a magnetic sensor device to activate a magnetic signal transmitting functionality. Act 940 comprises based upon the magnetic sensor device plan, causing the first magnetic sensor device to activate magnetic signal transmitting functionality. For example, as depicted and described with respect to FIGS. 6A and 6B, the mixed-reality system 600 causes magnetic sensor device 610 to activate magnetic signal transmitting functionality and magnetic devices 612 and 614 to activate magnetic signal receiving functionality.

Accordingly, described herein are embodiments related to wearable, mixed-reality computing systems, methods, and computer-readable media that enable an on-body device to dynamically switch operating modes. The systems may include various components that are configured to perform the processes outlined above. For instance, the system might include a transmitter component that coordinates the transmission of the magnetic field signal. Further, the system might include a receiver component that coordinates the receipt of the magnetic field signal. The system might also include a coordination component (which uses the secondary communication channel to coordinate communications between the on-body device and the base station).

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Computing system functionality can be enhanced by a computing systems' ability to be interconnected to other computing systems via network connections. Network connections may include, but are not limited to, connections via wired or wireless Ethernet, cellular connections, or even computer to computer connections through serial, parallel, USB, or other connections. The connections allow a computing system to access services at other computing systems and to quickly and efficiently receive application data from other computing systems.

Interconnection of computing systems has facilitated distributed computing systems, such as so-called "cloud" computing systems. In this description, "cloud computing" may be systems or resources for enabling ubiquitous, convenient, on-demand network access to a shared pool of configurable computing resources (e.g., networks, servers, storage, applications, services, etc.) that can be provisioned and released with reduced management effort or service provider interaction. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Cloud and remote based service applications are prevalent. Such applications are hosted on public and private remote systems such as clouds and usually offer a set of web based services for communicating back and forth with clients.

Many computers are intended to be used by direct user interaction with the computer. As such, computers have input hardware and software user interfaces to facilitate user interaction. For example, a modern general purpose computer may include a keyboard, mouse, touchpad, camera, etc. for allowing a user to input data into the computer. In addition, various software user interfaces may be available.

Examples of software user interfaces include graphical user interfaces, text command line based user interface, function key or hot key user interfaces, and the like.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer system for dynamically switching modes within a magnetic sensor device, the system comprising:
   one or more processors; and
   one or more computer-readable hardware storage devices having stored thereon executable instructions that when executed by the one or more processors configure the computer system to perform at least the following:
   communicate through a secondary communication channel with a first magnetic sensor device and a second magnetic sensor device, wherein the first magnetic sensor device includes at least a magnetic signal receiving functionality;
   determine that the second magnetic sensor device includes magnetic signal transmitting functionality and magnetic signal receiving functionality; and
   after determining that the second magnetic sensor device includes magnetic signal transmitting functionality, cause the second magnetic sensor device to begin transmitting a first magnetic field signal.

2. The computer system of claim 1, wherein the executable instructions include instructions that are executable to configure the computer system to:
   detect one or more magnetic sensor devices associated with another system;
   communicate through the secondary communication channel with a processing unit within the other system;
   receive information relating to the one or more magnetic sensor devices within the other system; and
   based upon the information, cause at least one of the first magnetic sensor device or the second magnetic sensor device to deactivate magnetic signal transmitting functionality and activate magnetic signal receiving functionality.

3. The computer system of claim 2, wherein the information indicates that causing at least one of the first magnetic sensor device or the second magnetic sensor device to deactivate magnetic signal transmitting functionality and activate magnetic signal receiving functionality will reduce noise within one or more magnetic communication channels.

4. The computer system of claim 1, wherein the executable instructions include instructions that are executable to configure the computer system to:
communicate through the secondary communication channel with a third magnetic sensor device;
determine that the third magnetic sensor device includes magnetic signal receiving functionality;
after determining that the third magnetic sensor device includes magnetic signal receiving functionality, cause the third magnetic sensor device to begin receiving a second magnetic field signal generated by the first magnetic sensor device; and
after receiving, with the third magnetic sensor device, the second magnetic field signal transmitted from the first magnetic sensor device, notify the first magnetic sensor device via the secondary communication channel that the second magnetic field signal was successfully received.

5. The computer system of claim 4, wherein:
the first magnetic sensor device is disposed within a first head mounted display;
the second magnetic sensor device is disposed within a first handheld controller that is in communication within the first head mounted display; and
the third magnetic sensor device is disposed within a second handheld controller that is in communication within the first head mounted display.

6. The computer system of claim 1, wherein the first magnetic sensor device is disposed within a head mounted display.

7. The computer system of claim 1, wherein the first magnetic sensor device is disposed within a handheld controller.

8. The computer system of claim 1, wherein the executable instructions include instructions that are executable to configure the computer system to:
detect that the first magnetic sensor device is in communication with a particular type of power source; and
after determining that the first magnetic sensor device is in communication with the particular type of power source, cause the first magnetic sensor device to activate magnetic signal transmitting functionality and the second magnetic sensor device to activate magnetic signal receiving functionality.

9. The computer system of claim 8, wherein the particular type of power source comprises a power outlet.

10. The computer system of claim 8, wherein the particular type of power source comprises a battery with a current charge level that is below a pre-defined threshold.

11. The computer system of claim 1, wherein the first magnet sensor device is disposed within a handheld controller.

12. A method for dynamically switching modes within a magnetic sensor device, the method being performed by one or more processors of a computer system, the method comprising:

communicating through a secondary communication channel with a plurality of magnetic sensor devices, wherein a first magnetic sensor device within the plurality of magnetic sensor devices includes magnetic signal transmitting functionality and magnetic signal receiving functionality;
receiving information associated with at least a portion of the plurality of magnetic sensor devices, wherein the information comprises sensor-specific characteristics;
calculating a magnetic sensor device plan based upon the information; and
based upon the magnetic sensor device plan, causing the first magnetic sensor device to activate magnetic signal transmitting functionality.

13. The method as recited in claim 12, wherein:
the information indicates a battery life associated with at least one magnetic sensor device; and
the magnetic sensor device plan is calculated based upon a determination that causing the first magnetic sensor device to activate magnetic signal transmitting functionality will maximize a cumulative battery life of the plurality of magnetic sensor devices.

14. The method as recited in claim 12, wherein the information indicates that the first magnetic sensor device is plugged into a power outlet.

15. The method as recited in claim 12, wherein the information indicates that the first magnetic sensor device has a greater battery life remaining than a second magnetic sensor device within the plurality of magnetic sensor devices.

16. The method as recited in claim 12, wherein the magnetic sensor device plan is calculated based upon a determination that causing the first magnetic sensor device to activate magnetic signal transmitting functionality and causing at least one other magnetic sensor device within the plurality of magnetic sensor devices to activate magnetic signal receiving functionality will increase the average signal to noise ratio for at least the portion of the plurality of magnetic sensor devices.

17. The method as recited in claim 12, further comprising based upon the magnetic sensor device plan, causing the first magnetic sensor device to activate magnetic signal receiving functionality, wherein the first magnetic sensor device transmits first magnetic field signals to a second magnetic sensor device and receives second magnetic field signals from a third magnetic sensor device.

18. The method as recited in claim 12, further comprising:
receiving updated information that indicates that a second magnetic sensor device has been plugged into a power outlet;
calculating an updated magnetic sensor device plan based upon the updated information; and
based upon the updated magnetic sensor device plan, causing the first magnetic sensor device to deactivate magnetic signal transmitting functionality and activate magnetic signal receiving functionality.

19. The method as recited in claim 12, wherein the first magnet sensor device is disposed within a head mounted display.

20. A computer system for dynamically switching modes within a magnetic sensor device, the system comprising:
one or more processors; and
one or more computer-readable hardware storage devices having stored thereon executable instructions that when executed by the one or more processors configure the computer system to perform at least the following:

communicate through a secondary communication channel with a plurality of magnetic sensor devices, wherein a first magnetic sensor device within the plurality of magnetic sensor devices includes magnetic signal transmitting functionality and magnetic signal receiving functionality;

receive information associated with at least a portion of the plurality of magnetic sensor devices, wherein the information comprises sensor-specific characteristics;

calculate a magnetic sensor device plan based upon the information; and based upon the magnetic sensor device plan, cause the first magnetic sensor device to activate magnetic signal transmitting functionality.

* * * * *